United States Patent
Yu et al.

(10) Patent No.: US 12,388,442 B2
(45) Date of Patent: Aug. 12, 2025

(54) UNIDIRECTIONAL HYBRID SWITCH CIRCUIT

(71) Applicant: IDEAL POWER INC., Austin, TX (US)

(72) Inventors: Ruiyang Yu, Austin, TX (US); Jiankang Bu, Austin, TX (US); Yifan Jiang, Austin, TX (US); R. Daniel Brdar, Driftwood, TX (US); Mudit Khanna, Austin, TX (US)

(73) Assignee: Ideal Power Inc., Austin, TX (US)

( * ) Notice: Subject to any disclaimer, the term of this patent is extended or adjusted under 35 U.S.C. 154(b) by 0 days.

(21) Appl. No.: 18/530,478

(22) Filed: Dec. 6, 2023

(65) Prior Publication Data
US 2025/0192771 A1    Jun. 12, 2025

(51) Int. Cl.
| H03K 17/567 | (2006.01) |
| H03K 17/66 | (2006.01) |
| H03K 17/687 | (2006.01) |
| H03K 17/74 | (2006.01) |
| H10D 84/40 | (2025.01) |

(52) U.S. Cl.
CPC ........... *H03K 17/567* (2013.01); *H03K 17/66* (2013.01); *H03K 17/687* (2013.01); *H03K 17/74* (2013.01); *H10D 84/403* (2025.01)

(58) Field of Classification Search
CPC .................................................. H03K 17/567
USPC .................................................. 327/108–112
See application file for complete search history.

(56) References Cited

U.S. PATENT DOCUMENTS

| 7,220,661 B1 | 5/2007 | Yu et al. |
| 7,599,196 B2 | 10/2009 | Alexander |
| 7,778,045 B2 | 8/2010 | Alexander |
| 8,295,069 B2 | 10/2012 | Alexander |

(Continued)

FOREIGN PATENT DOCUMENTS

| DE | 102021203861 A1 | 10/2022 |
| EP | 3185421 B1 | 12/2020 |
| WO | 2016000840 A1 | 7/2016 |

OTHER PUBLICATIONS

Dong Mouzhi et al: "B-TRAN (TM) Optimization and Performance Characterization", published in 2023 IEEE Applied Power Electronics Conference and Exposition (APEC), IEEE, Mar. 19, 2023 (Mar. 19, 2023), pp. 1835-1839, XP034351114, DOI: 10.1109/APEC3580.2023.10131453 [retrieved on May 31, 2023 p. 1838; figure 12.

*Primary Examiner* — Tomi Skibinski
(74) *Attorney, Agent, or Firm* — Dickinson Wright PLLC; Mark E. Scott

(57) ABSTRACT

Unidirectional hybrid switch. At least one example is a method operating a hybrid switch, the method comprising: sensing a voltage across an upper terminal and a lower terminal of the hybrid switch, the hybrid switch is forward biased when the upper terminal has higher voltage, and the hybrid switch is reverse biased when the lower terminal has higher voltage; when the hybrid switch is forward biased, selectively conducting a forward current from the upper terminal to the lower terminal by sharing the forward current between a FET switch and a BJT switch, the selectively conducting when a control terminal is asserted; and when the hybrid switch is reversed biased, non-selectively conducting a reverse current from the lower terminal to the upper terminal.

18 Claims, 8 Drawing Sheets

(56) References Cited

U.S. PATENT DOCUMENTS

| | | |
|---|---|---|
| 8,300,426 B2 | 10/2012 | Alexander |
| 8,345,452 B2 | 1/2013 | Alexander |
| 8,391,033 B2 | 3/2013 | Alexander |
| 8,395,910 B2 | 3/2013 | Alexander |
| 8,400,800 B2 | 3/2013 | Alexander |
| 8,406,025 B1 | 3/2013 | Alexander |
| 8,432,711 B1 | 4/2013 | Alexander |
| 8,441,819 B2 | 5/2013 | Alexander |
| 8,446,042 B2 | 5/2013 | Bundschuh et al. |
| 8,446,745 B1 | 5/2013 | Alexander |
| 8,451,637 B1 | 5/2013 | Alexander |
| 8,461,718 B2 | 6/2013 | Bundschuh et al. |
| 8,471,408 B2 | 6/2013 | Bundschuh et al. |
| 8,514,601 B2 | 8/2013 | Alexander |
| 8,531,858 B2 | 9/2013 | Alexander |
| 9,007,796 B2 | 4/2015 | Alexander |
| 9,029,909 B2 | 5/2015 | Blanchard et al. |
| 9,035,350 B2 | 5/2015 | Blanchard et al. |
| 9,042,131 B2 | 5/2015 | Barron et al. |
| 9,054,706 B2 | 6/2015 | Blanchard et al. |
| 9,054,707 B2 | 6/2015 | Blanchard et al. |
| 9,059,710 B2 | 6/2015 | Blanchard et al. |
| 9,077,185 B2 | 7/2015 | Alexander |
| 9,118,247 B2 | 8/2015 | Alexander |
| 9,130,461 B2 | 9/2015 | Alexander |
| 9,159,819 B2 | 10/2015 | Pfirsch et al. |
| 9,190,894 B2 | 11/2015 | Alexander et al. |
| 9,203,400 B2 | 12/2015 | Alexander et al. |
| 9,203,401 B2 | 12/2015 | Alexander et al. |
| 9,209,713 B2 | 12/2015 | Alexander et al. |
| 9,209,798 B2 | 12/2015 | Alexander et al. |
| 9,231,582 B1 | 1/2016 | Alexander et al. |
| 9,270,142 B2 | 2/2016 | Alexander |
| 9,293,946 B2 | 3/2016 | Alexander |
| 9,337,262 B2 | 5/2016 | Blanchard |
| 9,355,353 B2 | 5/2016 | Von Mueller et al. |
| 9,355,853 B2 | 5/2016 | Blanchard et al. |
| 9,356,595 B2 | 5/2016 | Alexander et al. |
| 9,647,553 B2 | 5/2017 | Alexander et al. |
| 9,742,385 B2 | 8/2017 | Alexander |
| 9,742,395 B2 | 8/2017 | Alexander et al. |
| 9,787,298 B2 | 10/2017 | Alexander et al. |
| 9,818,615 B2 | 11/2017 | Blanchard et al. |
| 9,899,932 B2 | 2/2018 | Alexander |
| 10,056,372 B2 | 8/2018 | Alexander |
| 10,211,283 B2 | 2/2019 | Alexander et al. |
| 10,418,471 B2 | 9/2019 | Alexander et al. |
| 10,497,699 B2 | 12/2019 | Alexander |
| 10,580,885 B1 | 3/2020 | Alexander et al. |
| 10,892,354 B2 | 1/2021 | Alexander et al. |
| 11,069,797 B2 | 7/2021 | Blanchard et al. |
| 11,411,557 B2 * | 8/2022 | Mojab ............... H10D 62/133 |
| 11,496,129 B2 | 11/2022 | Mojab |
| 11,522,051 B2 | 12/2022 | Mojab et al. |
| 11,637,016 B2 | 4/2023 | Blanchard et al. |
| 11,699,746 B2 | 7/2023 | Blanchard et al. |
| 11,777,018 B2 | 10/2023 | Blanchard et al. |
| 11,804,835 B2 | 10/2023 | Mojab |
| 11,881,525 B2 | 1/2024 | Bu et al. |
| 11,888,030 B2 | 1/2024 | Wood et al. |
| 2012/0051100 A1 | 3/2012 | Alexander |
| 2012/0279567 A1 | 11/2012 | Alexander |
| 2013/0307336 A1 | 11/2013 | Bundschuh et al. |
| 2013/0314096 A1 | 11/2013 | Bundschuh et al. |
| 2013/0342262 A1 | 12/2013 | Konstantinov |
| 2014/0319911 A1 | 10/2014 | Alexander |
| 2015/0061569 A1 | 3/2015 | Alexander et al. |
| 2015/0214782 A1 | 7/2015 | Alexander |
| 2015/0222146 A1 | 8/2015 | Alexander |
| 2015/0222194 A1 | 8/2015 | Bundschuh |
| 2015/0318704 A1 | 11/2015 | Barron et al. |
| 2016/0322350 A1 | 11/2016 | Blanchard |
| 2016/0322484 A1 | 11/2016 | Blanchard |
| 2016/0344300 A1 | 11/2016 | Alexander |
| 2017/0288561 A1 | 10/2017 | Lemberg et al. |
| 2017/0317575 A1 | 11/2017 | Alexander |
| 2017/0345917 A1 | 11/2017 | Basler et al. |
| 2018/0026122 A1 * | 1/2018 | Blanchard ............ H10D 64/112 257/127 |
| 2018/0109101 A1 | 4/2018 | Alexander |
| 2018/0226254 A1 | 8/2018 | Blanchard et al. |
| 2019/0140548 A1 | 5/2019 | Alexander |
| 2019/0267810 A1 | 8/2019 | Johns |
| 2020/0006945 A1 | 1/2020 | Lemberg et al. |
| 2023/0066664 A1 | 3/2023 | Mojab et al. |
| 2023/0299188 A1 | 9/2023 | Blanchard et al. |
| 2023/0386987 A1 | 11/2023 | Bu et al. |

\* cited by examiner

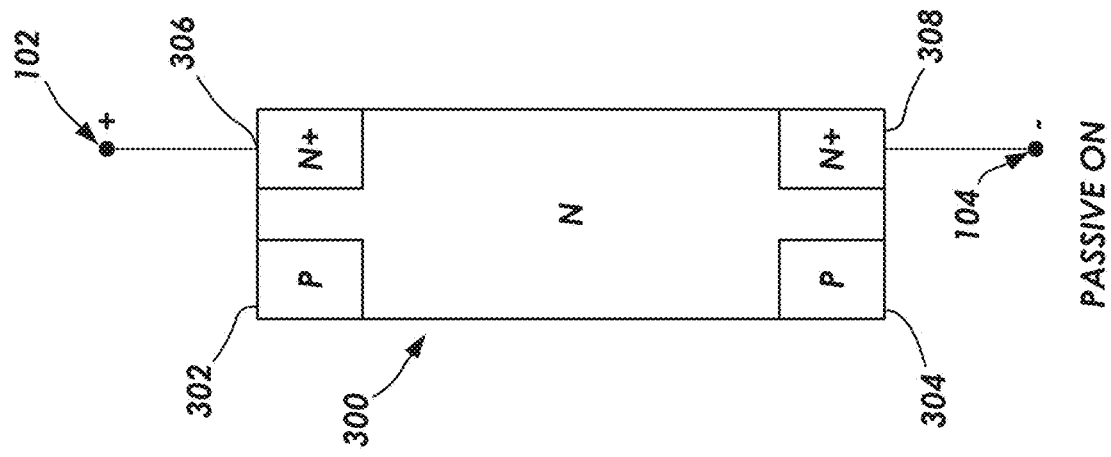
FIG. 4C PASSIVE ON
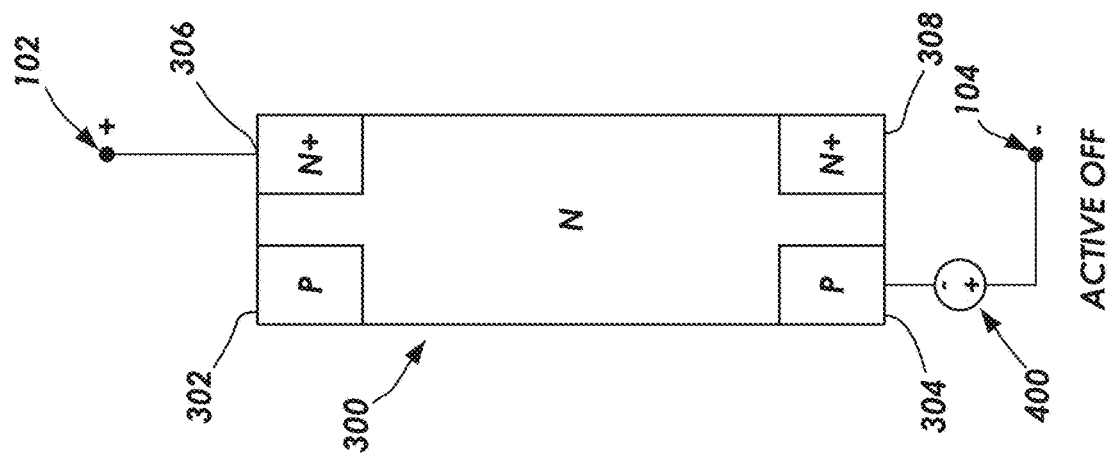
FIG. 4B ACTIVE OFF
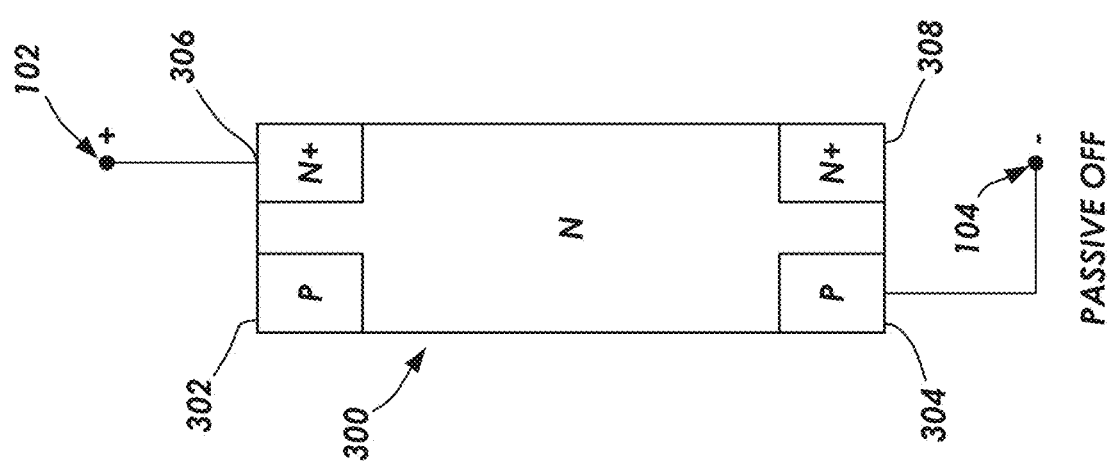
FIG. 4A PASSIVE OFF

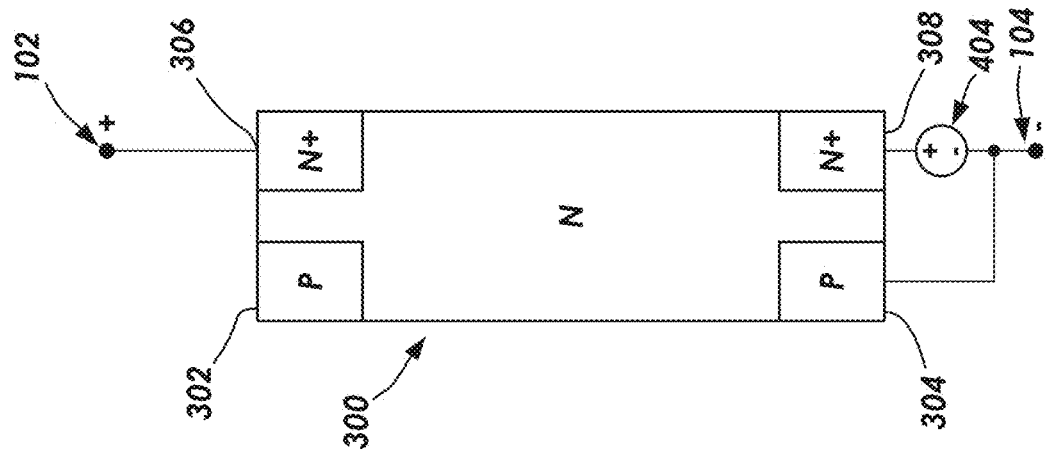
FIG. 4D ACTIVE ON
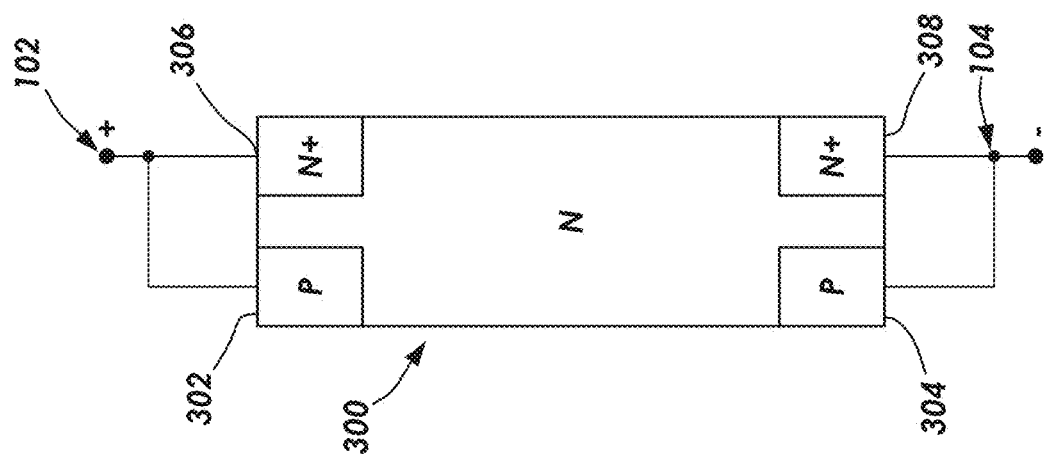
FIG. 4E PRE-TURNOFF
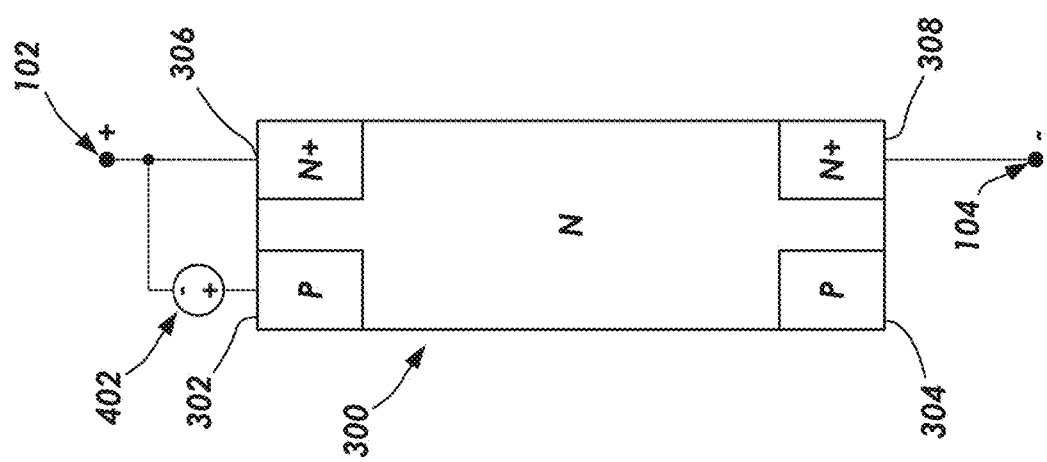
FIG. 4F REVERSE RECOVERY

UNIDIRECTIONAL HYBRID SWITCH CIRCUIT

TECHNICAL FIELD

This disclosure is related to electrically controlled switches and, more particularly, to hybrid switches that include bidirectional double-base bipolar junction transistors ("BDB BJT").

BACKGROUND

Many electrical systems make use of high voltages and currents. Such electrical systems may be employed in a variety of applications ranging from electric vehicles to consumer appliances. For example, in some electric vehicles, voltages of about 1200 Volts may be used to drive the electric motors.

During operation of such electrical systems, it may be necessary to disconnect or decouple a load circuit from a high-voltage source. To accomplish this, electrically controlled switches may be employed. In response to an assertion of a switch signal, an electrically controlled switch can couple a power source to a load circuit. And responsive to de-assertion of the switch signal, the electrically controlled switch can decouple the load from the power source.

SUMMARY

One example is a method operating a hybrid switch, the method comprising: sensing a voltage across an upper terminal and a lower terminal of the hybrid switch, the hybrid switch is forward biased when the upper terminal has higher voltage, and the hybrid switch is reverse biased when the lower terminal has higher voltage; when the hybrid switch is forward biased, selectively conducting a forward current from the upper terminal to the lower terminal by sharing the forward current between a FET switch and a BJT switch, the selectively conducting when a control terminal is asserted; and when the hybrid switch is reversed biased, non-selectively conducting a reverse current from the lower terminal to the upper terminal.

In the example method, conducting the reverse current may further comprise: initially conducting the reverse current through a first diode; and then conducting the reverse current through the BJT switch. Conducting the reverse current may further comprise sharing the reverse current between the BJT switch and the FET switch. The first diode may be a body diode of the FET switch. The first diode may be a discrete diode. The first diode may be a silicon carbide diode having an anode coupled to the lower terminal a cathode coupled to the upper terminal.

In the example method, selectively conducting the forward current may further comprises, responsive to assertion of the control terminal: conducting the forward current through the FET switch; and then conducting a first portion of the forward current through the FET switch and a second portion through the BJT switch. Selectively conducting the forward current may further comprise, responsive to de-assertion of the control terminal: making the BJT switch non-conductive and conducting the forward current through the FET switch; and then making FET switch non-conductive.

The example method may further comprise at least one selected from a group comprising: the FET switch comprises plurality of FETs coupled in parallel; and the BJT switch comprises a plurality of BJTs coupled in parallel.

Yet another example is a hybrid switch comprising: an upper terminal, a lower terminal, and a control terminal; a BJT defining an upper base, a lower base, an upper collector-emitter coupled to the upper terminal, and a lower collector-emitter; a lower cascode FET defining a drain coupled to the lower collector-emitter, a source coupled to the lower terminal, and a gate; a main FET defining a drain coupled to the upper terminal, a source coupled to the lower terminal, and a gate; a diode having an anode coupled to the lower terminal and a cathode coupled to the upper terminal; a driver coupled to the upper terminal, the lower terminal, the control terminal, the upper base, the lower base, the gate of the lower cascode FET, and the gate of the main FET. The driver may be configured to: sense an applied voltage across the upper terminal and the lower terminal; when the applied voltage is more positive on the upper terminal and the control terminal is de-asserted, arrange the BJT and main FET to block current flow through the hybrid switch; when the applied voltage is more positive on the upper terminal and the control terminal is asserted, enable a forward current to flow through from the upper terminal to the lower terminal, with the forward current shared between main FET and the BJT; and when the applied voltage is more positive on the lower terminal, enable a reverse current to flow through the hybrid switch.

In the example hybrid switch, when the driver enables the reverse current to flow, the driver may be configured to: allow the reverse current to initially flow through the diode; and then arrange the BJT such that the reverse current flows through the BJT.

In the example hybrid switch, when the driver enables the reverse current to flow, the driver may be further configured to arrange the main FET such that the reverse current is shared between the BJT and the main FET.

In the example hybrid switch, the diode may be a body diode of the main FET.

In the example hybrid switch, the diode may be a discrete diode distinct from the main FET.

In the example hybrid switch, the diode may be a silicon carbide diode.

In the example hybrid switch, when the driver enables the forward current to flow, the driver may be configured to: assert the gate of the main FET; and then arrange the BJT to be conductive in an active-on mode. When the applied voltage is more positive on the upper terminal and the control terminal becomes de-asserted, the driver may be configured to: make the BJT non-conductive while maintaining an asserted state of the gate of the main FET; and then de-assert the gate of the main FET to make main FET non-conductive.

The example hybrid switch may further comprise: an upper cascode FET defining a drain coupled to the upper terminal, a source coupled to the upper collector-emitter, and gate coupled to the driver; the driver is coupled to the lower collector-emitter; and wherein when the applied voltage is more positive on the upper terminal and the control terminal transitions from asserted to de-asserted, the driver may be further configured to: make the upper cascode FET non-conductive; and drive a reverse-recovery bias voltage to the lower collector-emitter.

BRIEF DESCRIPTION OF THE DRAWINGS

For a detailed description of example embodiments, reference will now be made to the accompanying drawings in which:

FIGS. 4A-4F show a bidirectional double-base bipolar junction transistor of PNP construction in shorthand form, with example external electrical connections, to illustrate several operational states;

Figure 1:
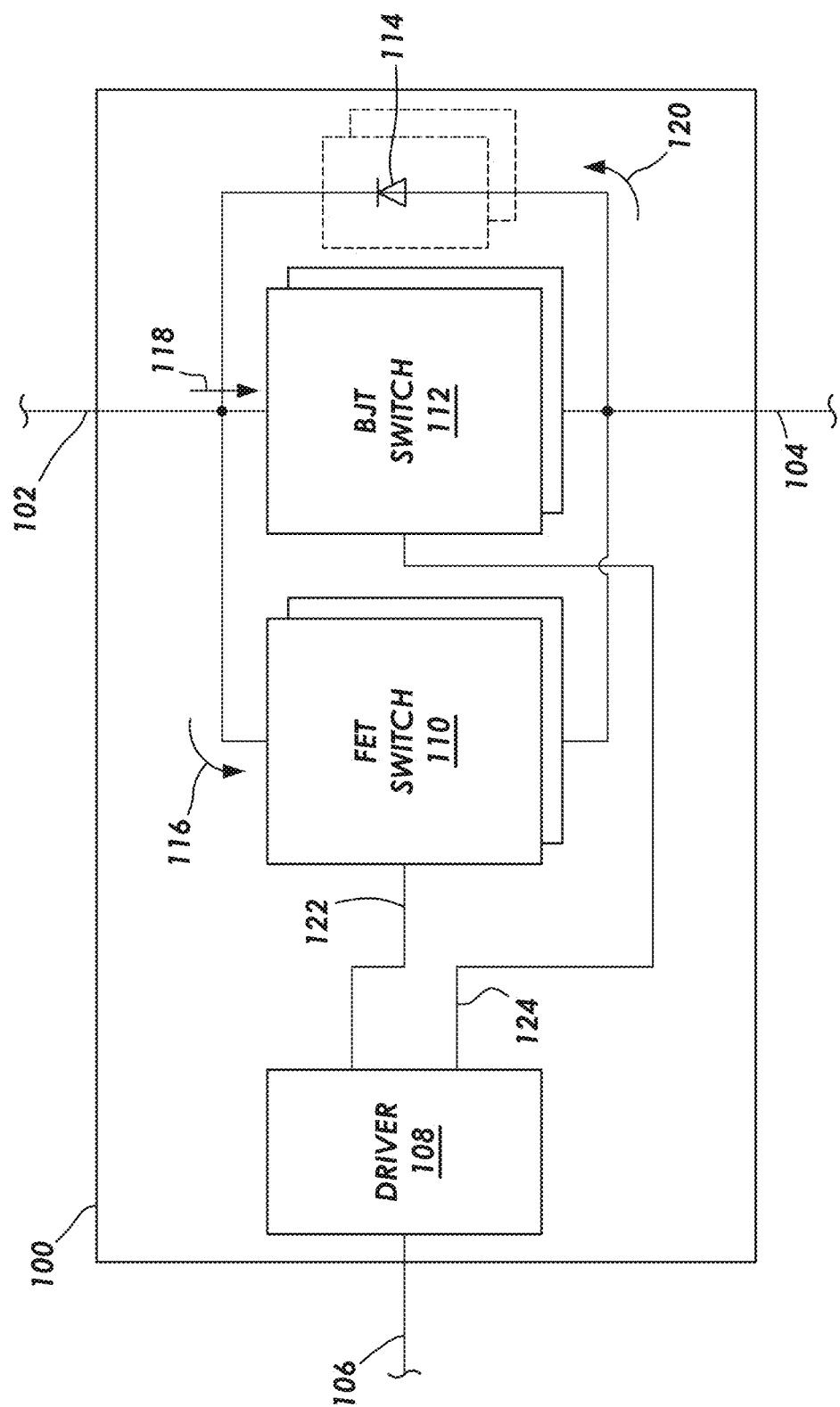
FIG. 1 is a block diagram of a hybrid switch in accordance with at least some embodiments.

Many of the electrical connections in the drawings are shown as direct couplings having no intervening devices, but not expressly stated as such in the following description. Nevertheless, this paragraph shall serve as antecedent basis in the claims for referencing any electrical connection as "directly coupled" for electrical connections shown in the drawing with no intervening device(s).

Definitions

Various terms are used to refer to particular system components. Different companies may refer to a component by different names—this document does not intend to distinguish between components that differ in name but not function. In the following discussion and in the claims, the terms "including" and "comprising" are used in an open-ended fashion and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

"A", "an", and "the" as used herein refers to both singular and plural referents unless the context clearly dictates otherwise. By way of example, "a processor" programmed to perform various functions refers to one processor programmed to perform each and every function, or more than one processor collectively programmed to perform each of the various functions. To be clear, an initial reference to "a [referent]", and then a later reference for antecedent basis purposes to "the [referent]", shall not obviate that the recited referent may be plural.

In relation to electrical devices (whether stand alone or as part of an integrated circuit), the terms "input" and "output" refer to electrical connections to the electrical devices, and shall not be read as verbs requiring action. For example, a differential amplifier (such as an operational amplifier) may have a first differential input and a second differential input, and these "inputs" define electrical connections to the operational amplifier, and shall not be read to require inputting signals to the operational amplifier.

"Assert" shall mean creating or maintaining a first predetermined state of a Boolean signal. Boolean signals may be asserted high, or with a higher voltage, and Boolean signals may be asserted low, or with a lower voltage, at the discretion of the circuit designer. Similarly, "de-assert" shall mean creating or maintaining a second predetermined state of the Boolean signal, opposite the asserted state.

"FET" shall mean a field-effect transistor, such as a junction-gate FET (JFET) or a metal-oxide semiconductor field effect transistor (MOSFET).

"BJT" shall mean a bipolar junction transistor, such as a bidirectional double-base bipolar junction transistor.

"Closing" in reference to an electrically controlled switch (e.g., a FET) shall mean making the electrically controlled switch conductive. For example, closing a FET used as an electrically controlled switch may mean driving the FET to a fully conductive state.

"Opening" in reference to an electrically controlled switch (e.g., a FET) shall mean making the electrically controlled switch non-conductive.

"Bidirectional double-base bipolar junction transistor" shall mean a junction transistor having a base and a collector-emitter on a first face or first side of a bulk region, and having a base and a collector-emitter on a second face or second side of the bulk region. The base and collector-emitter on the first side are distinct from the base and the collector-emitter on the second side.

"Collector-emitter" of a bipolar junction transistor shall mean a region of the bipolar junction transistor through which main load current flows. For purposes of this specification and claims, the designation as a collector-emitter is independent of the underlying device physics within the bipolar junction transistor. For example, for a double-sided, double-base PNP transistor, the main load current may flow from an upper P-type region, through the bulk N-type region, and then out the lower P-type region, and when so used the upper P-type region and the lower P-type region are considered collector-emitters. However, in other cases, such as described in co-pending and commonly assigned U.S. application Ser. No. 18/483,939 filed Oct. 10, 2023 and titled "Methods and Systems of Operating a PNP Bi-Directional Double-Base Bipolar Junction Transistor," the main load current may flow from an upper N-type region, through the bulk N-type region, and then through the lower N-type region, and when so used the upper and lower N-type regions are considered collector-emitters.

"Base" of a bipolar junction transistor shall mean a region of the bipolar junction transistor through which control current flows, the control current distinct from the main load current. For purposes of this specification and claims, the designation as a base is independent of the underlying device physics within the bipolar junction transistor. For example, for a double-sided, double-base PNP transistor, the control current may flow into an upper N-type region or a lower N-type region, and when so used the upper N-type region and the lower N-type region are considered bases. However, in other cases, such as described in co-pending and commonly assigned U.S. application Ser. No. 18/483, 939 noted above, the control current may flow into an upper P-type region or a lower P-type region, and when so used the upper and lower P-type regions are considered bases.

"Upper" in reference to component (e.g., upper terminal, upper collector-emitter, upper base) shall not be read to imply a location of the recited component with respect to gravity. Upper may be derived from location of the device in an example drawing.

"Lower" in reference to a component (e.g., lower terminal, lower collector-emitter, lower base) shall not be read to imply a location of the recited component with respect to gravity. Lower may be derived from location of the device in an example drawing.

"Controller" shall mean, alone or in combination, individual circuit components, an application specific integrated circuit (ASIC), a microcontroller with controlling software, a reduced-instruction-set computer (RISC) with controlling software, a digital signal processor (DSP), a processor with controlling software, a programmable logic device (PLD), a field programmable gate array (FPGA), or a programmable system-on-a-chip (PSOC), configured to read inputs and drive outputs responsive to the inputs.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

In various applications, switching of high voltages and currents may be needed. For example, in some electric vehicles, coupling and decoupling a load circuit to a high voltage supply (e.g., 1200V) may be common. In many systems, silicon carbide (SiC) switches are employed. To handle large currents, many SiC switches may be coupled in parallel so that each SiC switch handles only a portion of the overall current. However, using multiple SiC switches can result in a large die area and high cost. Additionally, when connecting multiple dies in parallel, current sharing during load transient is difficult to achieve. This results in slower turn-on and turn-off of the switches and hence higher switching losses To reduce the number of SiC switches used, various examples are directed to a hybrid switch that includes one or more large band gap switches (e.g., SiC, GaN), one or more bidirectional double-base bipolar junction transistors ("BDB BJTs"), and in some cases one or more discrete diodes. The addition of the BDB BJT(s) and discrete diode(s) enables use of fewer total switches for a designed current rating. BDB BJTs offer low conduction losses during the "on-state" and can conduct large current with lower costs per ampere than SiC and Gallium Nitride (GaN) devices. BDB BJTs are, however, slower to switch compared to large band gap devices and hence have higher switching losses. SiC devices, on the other hand, are able to switch faster but are more expensive for the same current to be conducted. The example hybrid switch discussed herein may achieve, at least in part, the benefit of both SiC/GaN devices and BDB BJTs by using SiC/GaN devices to handle switching, resulting in low switching loss, and using BDB BJT devices to conduct majority of the current during "on-state", resulting in low conduction loss.

The various examples described herein may provide techniques for operating a hybrid switch to enable unidirectional operation. That is, the hybrid switch selectively conducts current in one direction between two terminals, while non-selectively enabling current flow in the opposite direction. That is to say, when the hybrid switch is reverse biased, the hybrid switch non-selectively conducts the reverse current. More particularly, an example hybrid switch may sense a voltage across the hybrid switch between an upper terminal and a lower terminal, with forward bias defined as the upper terminal having higher voltage and reverse bias defined as the lower terminal having higher voltage. When forward biased, and when a control terminal is asserted, the example hybrid switch conducts a forward current from the upper terminal to the lower terminal by sharing the forward current between a FET switch and a BJT switch. When forward biased, but when the control terminal is de-asserted, the hybrid switch blocks current flow. When the hybrid switch is reversed biased, and regardless or independent of the state of the control terminal, the example hybrid switch conducts a reverse current from the lower terminal to the upper terminal. Initially, the reverse current is carried by one or more diodes. In one example, in steady state the reverse current is carried by the BJT switch. In another example, and again in steady state, the reverse current is shared between the BJT switch and the FET switch.

FIG. 1 shows a block diagram of an example hybrid switch 100. In particular, the example hybrid switch 100 defines an upper terminal 102, a lower terminal 104, and a control terminal 106. Internally, the example hybrid switches includes a driver 108, a FET switch 110, a BJT switch 112, and in some cases a diode 114. The driver 108 defines the control terminal 106, and the driver 108 is coupled to FET switch 110, as shown by connection 122, and is coupled to the BJT switch 112, as shown by connection 124. The driver 108 controls the conductive state of the FET switch 110 and the BJT switch 112 by arranging the voltages/currents on the connections 122 and 124. The FET switch 110 and the BJT switch 112 are electrically coupled in parallel such that forward current from the upper terminal 102 to the lower terminal 104 may be selectively shared between the FET switch 110 and the BJT switch 112. The diode 114 has an anode coupled to the lower terminal 104 and a cathode coupled to the upper terminal 102, and thus reverse current from the lower terminal 104 to the upper terminal 102 may initially flow through diode 114, and then the driver 108 may arrange the hybrid switch 100 to conduct the reverse current through the FET switch 110, the BJT switch 112, or share the reverse current between the FET switch 110 and the BJT switch 112.

One example of the hybrid switch 100 may include a single FET switch 110, a single BJT switch 112, and if present a single diode 114. Another example hybrid switch 100 may have one or more FET switches 110, one or more BJT switches 112, and one or more diodes 114, as illustrated in FIG. 1 by the "stacked" arrangement for the FET switch 110, the BJT switch 112, and the diode 114, respectively. When multiple FET switches 110 are present, the FET switches 110 are electrically connected in parallel to share the portion of the load current (forward or reverse) through the FET branch 116 of the hybrid switch 100. Similarly, when multiple BJT switches 112 are present, the BJT switches 112 are electrically connected in parallel to share the portion of the load current (forward or reverse) through the BJT branch 118 of the hybrid switch 100. If the hybrid switch 100 implements diode(s) 114, the diodes are electrically connected in parallel to share the portion of the reverse current that initially flows through the diode branch 120. So as not to unduly complicate the specification, the discussion that follows assumes a single FET switch 110, a single BJT switch 112, and a single diode 114. However, one having ordinary skill, with the benefit of this disclosure, understands that the multiple switches and/or diodes may be present depending on the designed current carrying capability of any specific hybrid switch.

Figure 2:
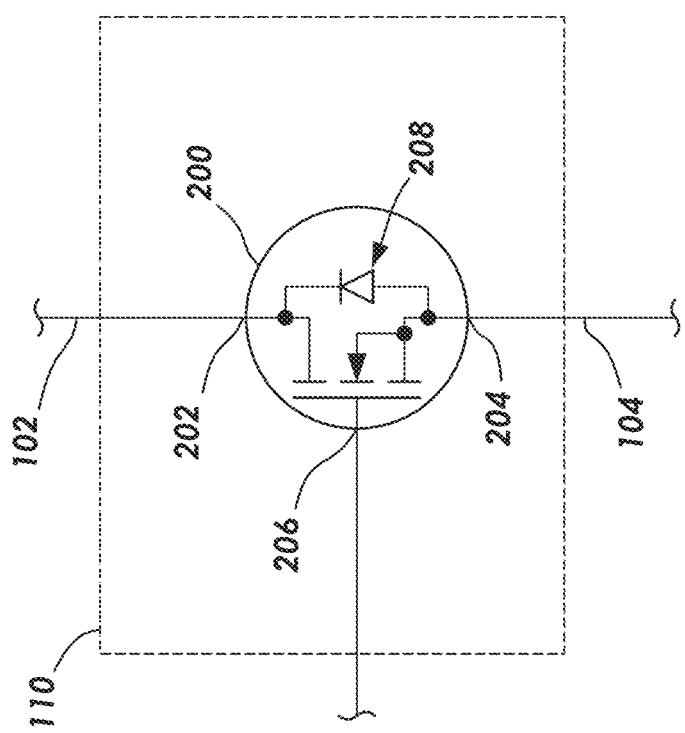
FIG. 2 is a schematic of a FET switch in accordance with at least some embodiments.

FIG. 2 shows a schematic of an example FET switch 110. In some examples, the FET switch 110 comprises a FET constructed on a substrate of SiC, hereafter just a SiC FET 200. The example SiC FET 200 is an N-channel device that defines a drain 202 coupled to the upper terminal 102, a source 204 coupled to the lower terminal 104, and a gate 206 coupled to the driver 108. The example SiC FET 200 also includes a body diode 208 defining an anode coupled to the source 204 and a cathode coupled to the drain 202. The presence of the body diode 208 may obviate the need to implement the diode 114. However, if the current carrying capability of the body diode 208 is too low and/or if the heat dissipation ability of the body diode 208 is too low, then example hybrid switches may implement the separate diode 114. Also, if the SiC FET 200 is implemented as an insulated gate device, in which case no body diode is present, then example hybrid switches may implement the diode 114.

The gate 206 of the SiC FET 200 is coupled to the driver 108. When the gate 206 is asserted (e.g., driven with the high voltage relative to the source 204), the SiC FET 200 becomes conductive. When the hybrid switch 100 is forward biased, the SiC FET 200 thus carries at least a portion of the forward current. As discussed in greater detail below, as the SiC FET 200 may have faster switching times than the BJT switch 112, initially the SiC FET 200 may carry all the forward current, and then the forward current may be shared with the BJT switch 112 as the BJT switch 112 becomes conductive. Still during forward bias but when the hybrid switch 100 is to be made non-conductive, the BJT switch 112 may be made non-conductive, forcing the reverse current to flow exclusively through the FET switch 110, and then the FET switch 110 is made non-conductive.

When the hybrid switch 100 is reverse biased, the body diode 208 of the SiC FET 200 initially carries at least a portion of the reverse current. The driver 108 may also assert the gate 206 of the SiC FET 200 when the hybrid switch 100 is reverse biased to enable a portion of the reverse current to flow through the SiC FET 200 from source-to-drain. However, the hybrid switch 100 non-selectively conducts the reverse current, and thus termination of the reverse current is based on the voltage across the hybrid switch 100 reducing to zero. It follows that the switching speed advantages of the SiC FET 200 may not be needed with respect to turn-off of the reverse current. Stated otherwise, in some cases the driver 108 refrains from asserting the gate 206 of the SiC FET 200 during periods when the hybrid switch 100 is reverse biased.

FIG. 2 is presented in terms of the FET switch 110 implementing a SiC FET 200; however, any other suitable wide band gap FET may be used, such as FET constructed on GaN, and thus the description in terms of the SiC FET 200 shall not be considered a limitation. The specification now turns to a more detailed discussion of the BJT switch 112.

Figure 3:
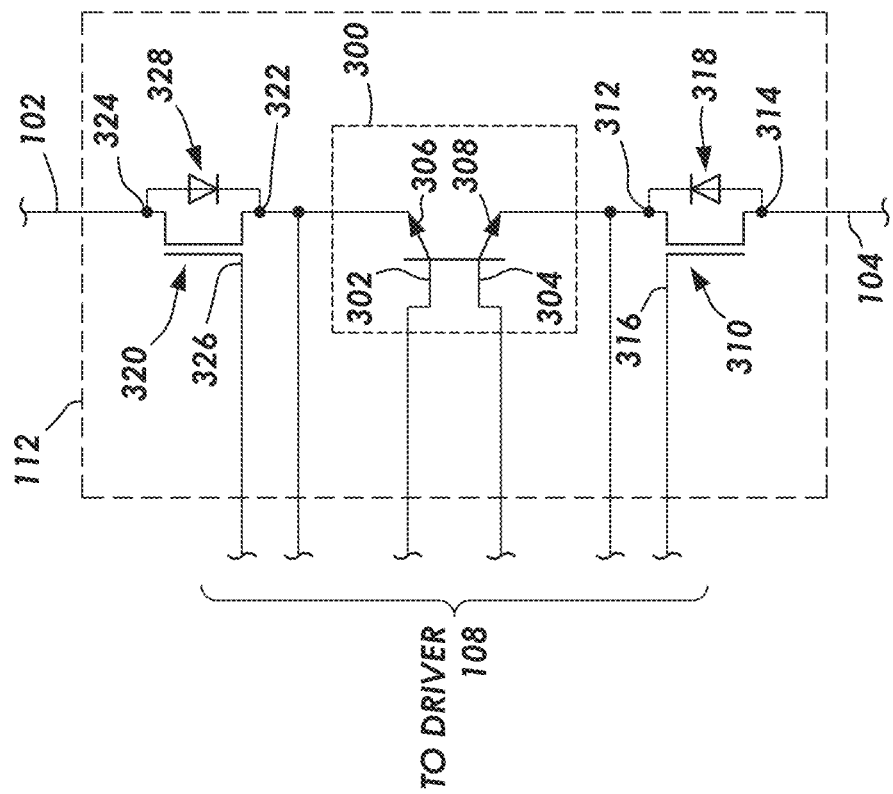
FIG. 3 shows a schematic of BJT switch in accordance with at least some embodiments.

FIG. 3 shows a schematic of an example BJT switch 112. In particular, the example BJT switch 112 comprises a BDB-BJT 300. The example BDB BJT 300 defines an upper base 302, a lower base 304, an upper collector-emitter 306, and a lower collector-emitter 308. The example BJT switch 112 further includes lower cascode FET 310 that defines a drain 312 coupled to the lower collector-emitter 308, a source 314 coupled to the lower terminal 104, a gate 316 coupled to the driver 108, and a body diode 318. Finally, the example BJT switch 112 includes an upper cascode FET 320 that defines a drain 322 coupled to the upper collector-emitter 306, a source 324 coupled to the upper terminal 102, a gate 326 coupled to the driver 108, and a body diode 328.

The driver 108 is coupled to the BJT switch 112 by a plurality of electrical connections. In the example of FIG. 3, the electrical connections to the driver 108 include connections to: the gate 326 of the upper cascode FET 320; the upper collector-emitter 306; the upper base 302; the lower base 304; the lower collector-emitter 308; and the gate 316 of the lower cascode FET 310. In order to describe when each of these connections to the driver 108 may be active, the specification turns to example operation of the BDB BJT 300.

FIGS. 4A-4F show, in shorthand form, a partial cross-sectional view of an example BDB BJT 300 of PNP construction to illustrate several operational states. In particular, FIGS. 4A-4F show six example states of the BDB BJT 300 arranged for the main load current to be carried across or through the N-type regions, the six states being: passive off (FIG. 4A); active off (FIG. 4B); passive on (FIG. 4C); active on (FIG. 4D); pre-turn off (FIG. 4E); and reverse recovery (FIG. 4F). In the examples of FIGS. 4A-4F, the hybrid switch 100 is assumed to be forward biased (i.e., having the more positive polarity associated with the upper terminal 102 relative to the lower terminal 104).

FIG. 4B shows a passive-off arrangement of the example BDB BJT 300. FIG. 4A shows the upper terminal 102 and lower terminal 104. Electrically between the upper terminal 102 and the lower terminal 104 resides the BDB BJT 300. The upper base 302 is electrically floated by the driver 108. The upper collector-emitter 306 is coupled to the upper terminal 102, such as through the upper cascode FET 320 or its body diode 328. The lower base 304 is coupled to the lower terminal 104 by the driver 108. The lower collector-emitter 308 is electrically floated, such as by the lower cascode FET 310 being open and its body diode 318 being non-conductive because of the applied voltage. In the arrangement of FIG. 4A, the BDB BJT 300 may have a breakdown voltage of 600V or greater, and in some cases about 1200V. Thus, no appreciable current flows through the BDB BJT 300 because of the blocking performed by PN junction formed between the lower base 304 and the upper collector-emitter 306. The state of FIG. 4A is referred as "passive off" because the electrical arrangement can be implemented with purely passive components (e.g., diodes and resistors), and thus the driver 108 need not have operational power to implement the arrangement of FIG. 4A. In the passive-off arrangement, the BDB BJT 300 blocks voltage and current, and thus the non-conductive lower cascode FET 310 may experience a relatively small drain-to-source voltage (e.g., 30V or less for 1200V applied across the upper terminal 102 and lower terminal 104).

FIG. 4B shows an active-off arrangement of the example BDB BJT 300. In particular, the upper base 302 is electrically floated by the driver 108. The upper collector-emitter 306 is coupled to the upper terminal 102, such as through the upper cascode FET 320 or its body diode 328. The lower base 304 is coupled, through the driver 108, to the lower terminal 104 by way of a voltage source 400. The lower collector-emitter 308 is electrically floated, such as by the lower cascode FET 310 being open and its body diode 318 being non-conductive because of the applied voltage. The voltage source 400 provides a negative bias to the lower base 304 relative to the lower collector-emitter 308. In the arrangement of FIG. 4B, the BDB BJT 300 may have a breakdown voltage of 600 Volts or greater, and in some cases about 1200 Volts. Thus again, in the active-off arrangement, no appreciable current flows through the BDB BJT 300 because of the blocking performed by the PN junction formed between the lower base 304 and the upper collector-emitter 306. The example state of FIG. 4B is referred as "active off" because in the electrical arrangement of FIG. 4B the driver 108 uses operational power to implement the arrangement (e.g., to power the voltage source 400). In the active-off arrangement of FIG. 4B, again the BDB BJT 300 blocks voltage and current, and thus the non-conductive lower cascode FET 310 may experience a small drain-to-source voltage (e.g., 30V or less).

FIG. 4C shows a passive-on arrangement of the example BDB BJT 300. In particular, the upper base 302 is electrically floated by the driver 108. The upper collector-emitter 306 is coupled to the upper terminal 102, such as through the upper cascode FET 320 or its body diode 328. The lower base 304 is electrically floated by the driver 108. The lower collector-emitter 308 is coupled to the lower terminal 104 by way of the lower cascode FET 310. The voltage drop across the BDB BJT 300 in the arrangement of FIG. 4C is based on the substrate resistance (e.g., for a 260 µm thick substrate, about 2 ohms). The example state of FIG. 4C is referred as "passive on" because the conductive state does not involve injection of charge carriers to lower the forward voltage drop $V_{CEON}$. Injection of charge carriers is shown in the active-on arrangement of FIG. 4D.

FIG. 4D shows an active-on arrangement of the example BDB BJT 300, still with the hybrid switch 100 forward biased. In particular, the upper base 302 is coupled, through the driver 108, to the upper terminal 102 by way of a voltage source 402. The upper collector-emitter 306 is coupled to the upper terminal 102, such as through the upper cascode FET 320 or its body diode 328. The lower base 304 is electrically floated by the driver 108. The lower collector-emitter 308 is coupled to the lower terminal 104 through lower cascode FET 310. The voltage source 402 provides a positive bias to the upper base 302 relative to the upper collector-emitter 306, and the voltage source 402 may provide any suitable bias voltage (e.g., 0.2 V-2V). The voltage source 402 injects charge carriers across the PN junction into the bulk substrate, which lowers forward voltage drop $V_{CEON}$, measured from the upper collector-emitter 306 to the lower collector-emitter 308, to about 0.2V for 30 Amps (A) of main current flow, compared to about 10-20V in the absence of charge carrier injection, such as the passive-on arrangement.

FIG. 4E shows a pre-turnoff arrangement of the example BDB BJT 300. In particular, the upper base 302 is coupled, by way of the driver 108, to the upper terminal 102. The upper collector-emitter 306 is coupled to the upper terminal 102, such as through the upper cascode FET 320 or its body diode 328. The lower base 304 is coupled, by the driver 108, to the lower terminal 104. The lower collector-emitter 308 is coupled to the lower terminal 104 by way of the lower cascode FET 310. An equivalent arrangement may be to omit the coupling of the upper base 302 to the upper terminal 102. In the pre-turnoff arrangement of FIG. 4E, the example BDB BJT 300 presents about 2 ohm resistance across the terminals 102 and 104. Thus, for the example 30A main load current, in the pre-turn off arrangement of FIG. 4E presents about a 60V drop from the upper terminal 102 to the lower terminal 104.

FIG. 4F shows a reverse recovery arrangement of the example BDB BJT 300. In particular, the upper collector-emitter 306 is coupled to the upper terminal 102. The lower base 304 is coupled, by the driver 108, to the lower terminal. The lower collector-emitter 308 is coupled, through the driver 108, to the lower terminal 104 by way of a voltage source 404. The upper base 302 may be electrically floated by the driver 108. The reverse recovery arrangement of FIG. 4F may be used to shorten the diode reverse recovery time of the PN junction formed by the lower base 304 and the N-type substrate after a period of conduction from the upper collector-emitter 306 to the lower collector-emitter 308, as the PN junction formed by the lower base 304 becomes the primary current/voltage blocking mechanism of the BDB BJT 300 when forward biased. That is, the positive voltage between lower collector-emitter 308 and the lower base 304 pinches off N+/P region formed between the lower collector-emitter 308 and the lower base 304, to reduce reverse recovery current between the upper collector-emitter 306 and the lower base 304.

With respect to transitions of the hybrid switch 100 from non-conductive to conductive, the example BDB BJT 300 may be arranged to transition from either the passive-off arrangement of FIG. 4A or active-off arrangement of FIG. 4B directly to the active-on arrangement of FIG. 4D without implementing an intermediate arrangement or state. Nevertheless, the passive-on arrangement of FIG. 4C may find use in some circumstances. With the respect to transitions of the hybrid switch 100 from conductive to non-conductive, the example BDB BJT 300 may be transitioned from the active-on arrangement of FIG. 4D directly to the active-off arrangement of FIG. 4B or the passive-off arrangement of FIG. 4A without implementing an intermediate arrangement or state. In other cases, the example BDB BJT 300 may be transitioned from the active-on arrangement of FIG. 4D to the reverse recovery arrangement of FIG. 4E for a predetermined period of time (e.g., 400 nanoseconds or less), and then transition to the passive-off or active-off arrangements. Nevertheless, the passive-on arrangement of FIG. 4C and the pre-turnoff arrangement of FIG. 4E may find use in some circumstances.

The examples of FIGS. 4A-4F are for the hybrid switch 100 being forward biased. However, the example BDB BJT 300 is a symmetrical device, and now understanding how to control current through the BDB BJT when the hybrid switch 100 is forward biased, control of current when the hybrid switch 100 is reverse biased (i.e., having the more positive polarity associated with the lower terminal 104 relative to the upper terminal 102) directly follows. Moreover, now understanding various operational states of the PNP configuration with main load current flowing through the N-type regions, one of ordinary skill could derive equivalent arrangements for PNP arrangement with main load current flowing through the P-type regions, and for NPN arrangements.

Returning again to FIG. 1, in some examples the diode 114 is of SiC construction. Use of a diode 114 of SiC construction enables the diode 114 to quickly become conductive when the hybrid switch is reverse biased. In yet still other cases, particularly when the FET switch 110 implements a body diode, the diode 114 may be of silicon construction to reduce costs. That is, when the hybrid switch 100 is reverse biased, the reverse current may initially flow through the body diode(s) of the FET branch 116, and then the current may be shared as the silicon-construction diode 114 becomes conductive.

Figure 5:
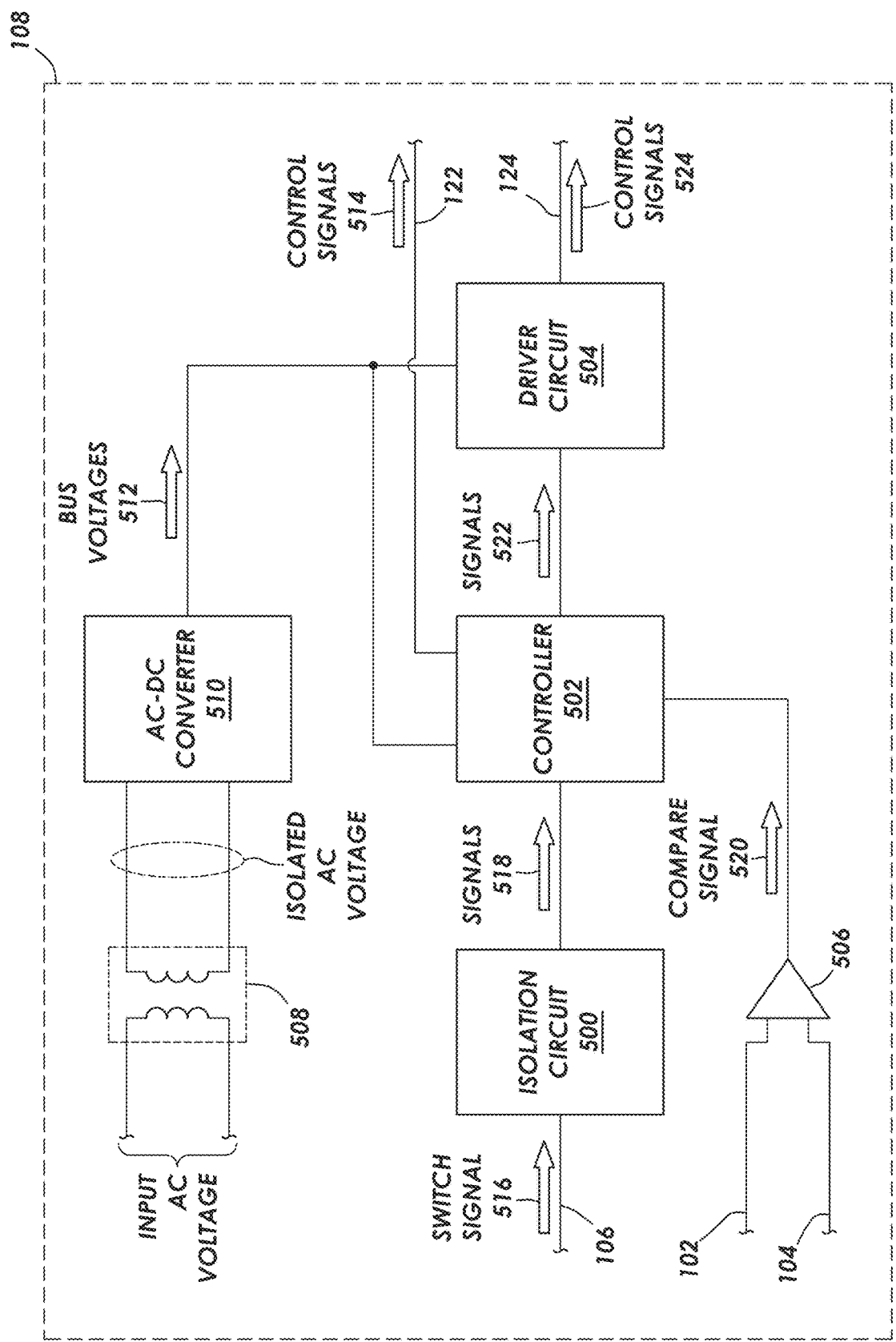
FIG. 5 shows a block diagram of a driver in accordance with at least some embodiments.

FIG. 5 shows a block diagram of an example driver 108. In particular, the example driver 108 includes an isolation circuit 500, a controller 502, a driver circuit 504, a comparator 506, a transformer 508, and an AC-DC converter 510. A primary winding of transformer 508 is coupled to an input AC voltage. Transformer 508 is configured to generate isolated AC voltage on its secondary winding based on the input AC voltage. In some embodiments, transformer 508 may include a core made of ferrous material and/or one or more taps on the secondary winding. Although a single transformer is depicted in the embodiment of FIG. 5, in other examples multiple transformers may be employed to provide different AC voltages to AC-DC converter 510.

The AC-DC converter 510 is configured to generate bus voltages 512. In some examples, the bus voltages 512 may include multiple voltage levels (e.g., 3.3V, 5V, 12V, and the like) for use by controller 502 to generate the voltages for various ones of control signals 514 applied to the FET switch 110 by way of the connection 122. Similarly, the bus voltages may be used by the driver circuit 504 to generate the voltages for various ones of control signals 524 applied to the BJT switch 112 by way of the connection 124. The AC-DC converter 510 may be implemented using a rectifier circuit, one or more capacitors, one or more power converter circuits (e.g., buck converters), or any other suitable circuit components or sub-circuits.

The driver 108 may be in a different electrical domain than circuits that generate the switch signal 516 applied to the control terminal 106. To account for the difference in electrical domains, isolation circuit 500 is employed. The isolation circuit 500 is configured to generate signals 518 based on switch signal 516, such that signals 518 are in a different electrical domain from switch signal 516. Isolation circuit 500 may be implemented using optocouplers, capacitive isolation devices, or any other circuits configured to translate a signal from one electrical domain to another.

Comparator 506 has a first input coupled to the upper terminal 102, a second input coupled to the lower terminal 104, and defines a compare output. The comparator 506 is configured to generate compare signal 520 on the compare output based on respective voltage levels of terminals 102 and 104. A voltage level of compare signal 520 may indicate which of terminals 102 or 104 has a greater voltage, and thus indicate whether the hybrid switch 100 is forward biased or reverse biased. For example, an asserted state of the compare signal 520 may indicate forward bias, while a non-asserted state of the compare signal 520 may indicate reverse bias. Comparator 506 may be implemented using a differential amplifier circuit, a Schmitt trigger circuit, or any other suitable circuit configured to generate an output signal whose voltage level is based on a comparison of respective voltage levels of at least two input signals.

Controller 502 is configured to generate signals 522 applied to the driver circuit 504, and to generate control signals 514 applied to the FET switch 110. Responsive to the signals 522, the driver circuit 504 arranges the BJT switch 112 into various states as described in FIGS. 4A-4F. Controller 502 may be implemented using individual circuit components, an application specific integrated circuit (ASIC), a microcontroller configured to execute software or program instructions, a reduced instruction set computer (RISC), a digital signal processor (DSP) circuit, a processor or processor core configured to execute software or program instructions, a programmable-logic device (PLD), a field programmable gate array (FPGA), a programmable system-on-a-chip (SoC), or any suitable combination thereof.

Driver circuit 504 is configured to generate control signals 524 using signals 522 and one or more of the voltage levels included in bus voltages 512. The driver circuit 504 may be used to place the BJT switch 112 into the various states as described in FIGS. 4A-4F. In various embodiments, driver circuit 504 may be implemented using multiple switches, FETs, or any other suitable switching devices.

Figure 6:
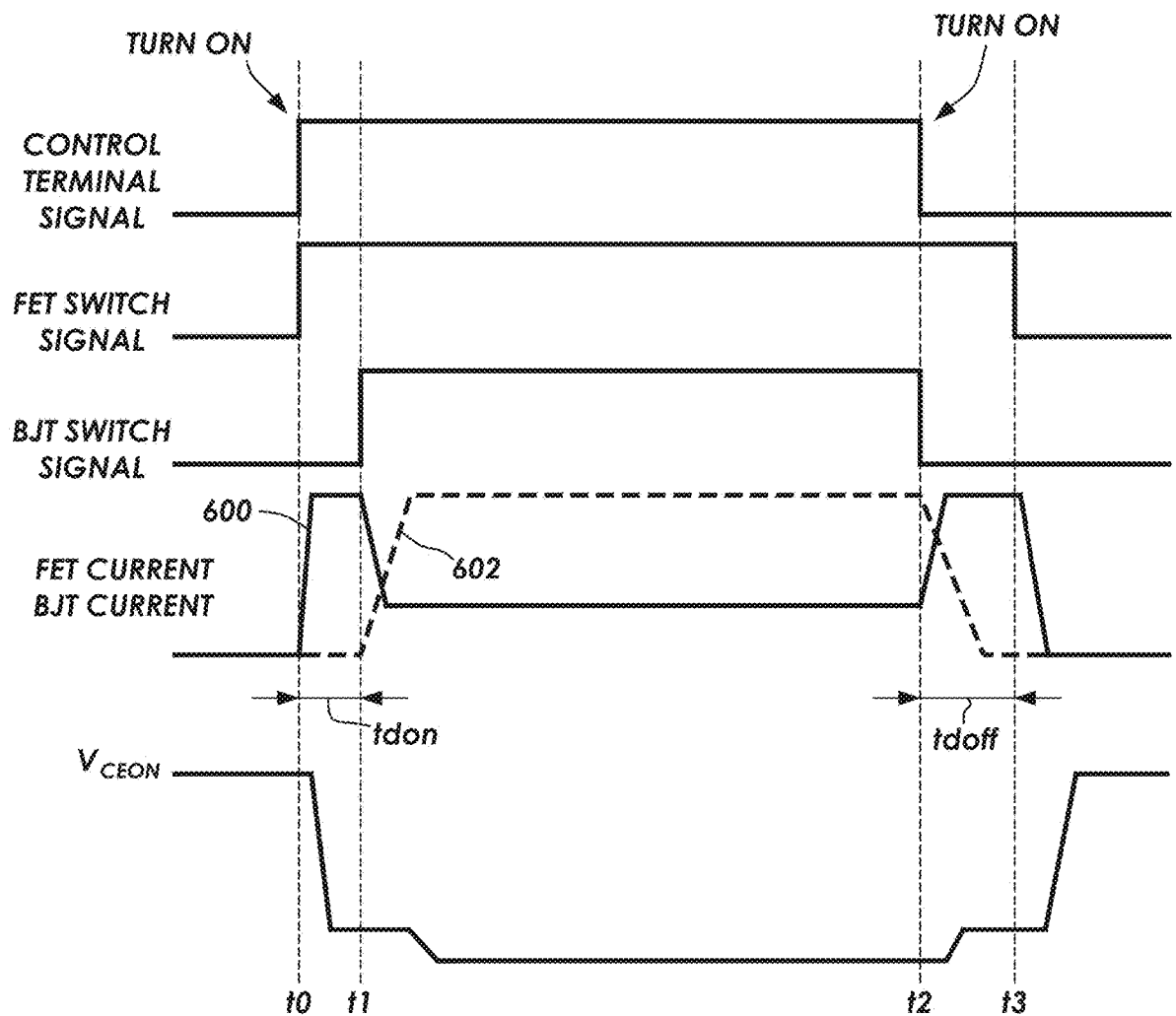
FIG. 6 shows a timing diagram associated with the operation of the example hybrid switch, in accordance with at least some embodiments.

FIG. 6 shows a timing diagram associated with a forward biased hybrid switch 100 transitioning from non-conductive to conductive, and from conductive to non-conductive. In particular, shown in FIG. 6 are control signals associated with the control terminal 106, the gate of the FET switch 110, and the BJT switch 112. FIG. 6 further co-plots current through the FET switch 110 and the BJT switch 112, and the voltage drop across the hybrid switch—$V_{CEON}$. For ease of discussion, the control signals associated with the BJT switch 112 are shown as a single representative signal asserted high or with a higher voltage; however, as discussed with respect to FIGS. 4A-4F, several control signals are generated and used by the driver circuit 504 to arrange the BDB BJT 300 into the various conductive and non-conductive states.

In the example timing diagram, at time t0 the control terminal 106 is asserted by an external device. In the example, the control terminal 106 is asserted high or with a high voltage. Responsive to assertion of control terminal 106, the example driver 108 asserts the gate of the FET switch 110. There may be a short time delay or propagation delay between assertion of the control terminal 106 and the assertion of the gate of the FET switch 110, but that delay is not reflected in FIG. 6 so as not to unduly complicate the figure or the discussion. Asserting the gate of the FET switch 110 makes the FET switch 110 conductive, and thus the forward current initially flows in the FET switch 110, as shown by line 600 associated with the FET current. The forward current flowing through the FET switch 110 thus results in an initial drop of the $V_{CEON}$ between times t0 and t1.

After a predetermined on-delay "tdon," the driver 108 arranges the BJT switch 112 to be conductive, the arranging illustrated in FIG. 6 by assertion (at time t1) of the representative control signal associated with the BJT switch 112. As the BJT switch 112 becomes conductive, the forward current is shared with the BJT switch 112 as shown line 602 associated with the BJT current. In steady state, the BJT switch 112 carries the majority of the forward current as shown by line 602, and the FET switch 110 carries a lesser but non-zero portion of the forward current as shown by line 600. Given how quickly the FET switch 110 transitions to conductive compare to the BJT switch 112, in some cases the predetermined on-delay "tdon" may be zero, and nevertheless the forward current may initially flow exclusively through the FET switch 110 as the BJT switch 112 becomes conductive, resulting in an equivalent relationship of the FET current and BJT current as shown in FIG. 6.

Still referring to FIG. 6, and still considering the hybrid switch 100 forward biased, now consider time t2 at which the control terminal 106 is de-asserted by an external device, indicating the hybrid switch 100 should be made non-conductive. Responsive to de-assertion of the control terminal 106, the driver 108 is designed and constructed to transition the BJT switch 112 to non-conductive, as shown by the representative control signal going de-asserted. There may be a short time delay or propagation delay between de-assertion of the control terminal 106 and the arrangement of the various signals to make the BJT switch 112 non-conductive, but that delay is not shown in FIG. 6 so as not to unduly complicate the figure or the discussion. Thus, as the BJT switch 112 transitions to non-conductive, the portion of the forward current carried by the BJT switch 112 ramps downward, and simultaneously the portion of the forward current carried by the FET switch 110 ramps upward, as shown by the lines 600 and 602 between times t2 and t3. The example driver 108 is further designed and constructed to, after a predetermined off-delay "tdoff," de-assert the gate of the FET switch 110 at time t2, thus making the hybrid switch 100 non-conductive.

Returning to FIG. 5, now consider periods of time when the hybrid switch 100 is reversed biased. The reverse current initially flows through one or more diodes, such as the diode 114 and/or a body diode 208 associated with the FET switch 110. That is to say, the driver 108, and particularly the controller 502, need take no action for the reverse current to initially flow from the lower terminal 104 to the upper terminal 102 through the diodes. However, the controller 502 receives the compare signal 520 from the comparator 506 and ascertains when the hybrid switch 100 is reverse biased. Once the reverse bias condition is sensed, the controller 502 is designed and constructed to make one or both the FET switch 110 and the BJT switch 112 conductive. That is, responsive to the compare signal 520 indicating a reverse biased condition, in one example the controller 502 is designed and constructed to command the driver circuit 504 to arrange the BJT switch 112 to conduct reverse current from the lower terminal 104 to the upper terminal 102 (e.g., an active-on arrangement). Inasmuch as the BJT switch 112, in the active-on arrangement, may have a voltage drop of about 0.2V, in some cases the BJT switch 112 may carry the entire reverse current once fully conductive. Stated otherwise, the reverse current may initially flow through a diode (e.g., diode 114 or a body diode of the FET switch 110), but because the voltage drop across the BDB BJT 300 may be driven lower than the forward voltage drop of the diode(s), the entire reverse current may flow through the BJT.

In alternative cases, the controller 502 is designed and constructed to arrange the FET switch 110 to conduct reverse current from the lower terminal 104 to the upper terminal 102. That is, here again the reverse current initially flows through one or more diodes, such as the diode 114 and/or the body diode 208. However, once the controller 502 senses the reverse biased condition, the controller 502 is designed and constructed to make the example SiC FET of the FET switch 110 conductive. The drain-to-source voltage of a fully conductive SiC FET 200 may be about 2.0V, and thus even when the SiC FET 200 110 is fully conductive, the reverse current may be shared between the diode(s) (e.g., diode 114 and/or the body diode 208) and SiC FET 200.

In yet still further cases, the controller 502 is designed and constructed to arrange the FET switch 110 and the BJT switch 112 to conduct reverse current from the lower terminal 104 to the upper terminal 102. As before, the reverse current initially flows through one or more diodes, such as the diode 114 and/or the body diode 208. However, once the controller 502 senses the reverse biased condition, the controller 502 is designed and constructed to make both the FET switch 110 and the BJT switch 112 conductive. Because the BJT switch 112, in the active-on arrangement, may have a voltage drop of about 0.2V, once the BJT switch 112 is fully conductive, the voltage drop across the hybrid switch 100 may be low enough that the diode(s) no longer participate in conducting the reverse current—the reverse current may be shared between the FET switch 110 and the BJT switch 112.

Figure 7:
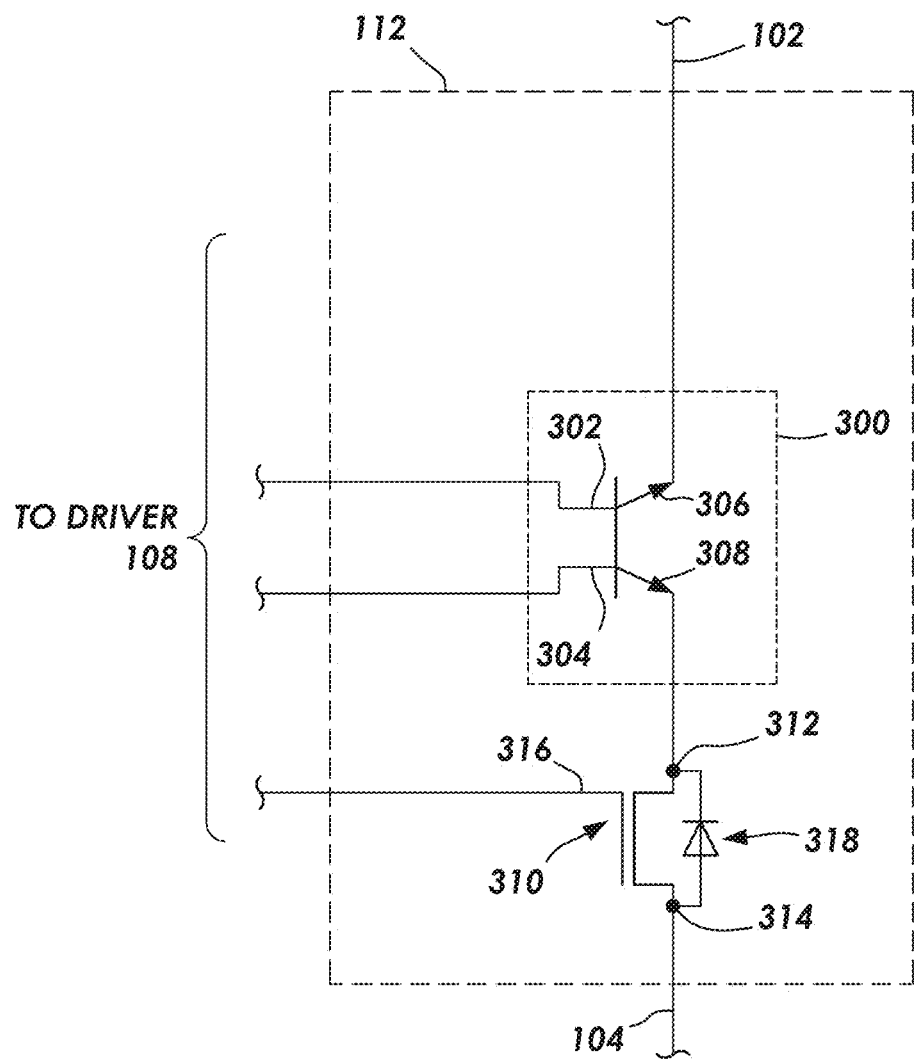
FIG. 7 shows a schematic of BJT switch in accordance with at least some embodiments.

FIG. 7 shows a schematic of another example BJT switch 112. As before, the BJT switch 112 comprises the BDB-BJT 300. However, in the alternative arrangement of FIG. 7, the upper collector-emitter 306 is coupled directly to the upper terminal 102. Stated otherwise, in the alternative arrangement of FIG. 7 the upper cascode FET is omitted. In the absence of the upper cascode FET, the reverse recovery arrangement of FIG. 4F cannot be implemented because the upper collector-emitter 306 cannot be electrically floated. It follows, the electrical connection between the driver 108 and the lower collector-emitter 308 may be omitted as shown. While the example BJT switch 112 can still utilize the reverse recovery after reverse current flow, reverse recovery for reverse current is of lesser concern because the reverse current ends naturally as the voltage across the hybrid switch 100 reduces to zero. Thus, the electrical connection between the driver 108 and the upper collector-emitter 306 may also be omitted. The example BJT switch of FIG. 7 is otherwise identical to FIG. 3, and thus the various components will not be re-introduced again here.

Figure 8:
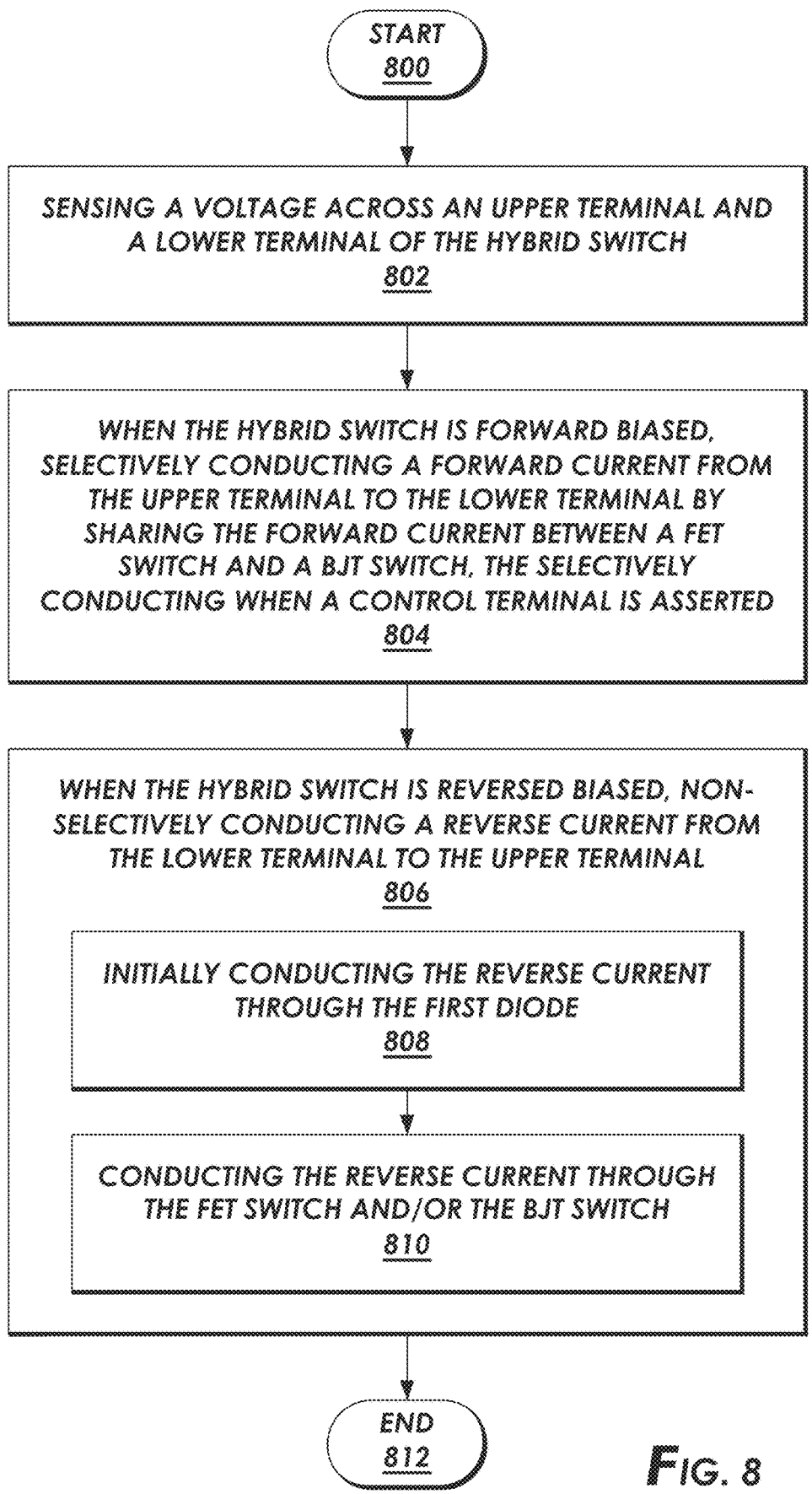
FIG. 8 shows a method in accordance with at least some embodiments.

FIG. 8 shows an example method. In particular, the method starts (block 800) and comprises sensing a voltage across an upper terminal and a lower terminal of the hybrid switch (block 802). For purposes of this disclosure and the claims, the hybrid switch is considered forward biased when the upper terminal has higher voltage, and the hybrid switch is considered reverse biased when the lower terminal has higher voltage; however, the "forward" and "reverse" designations are arbitrarily assigned. When the hybrid switch is forward biased, the example method comprises selectively conducting a forward current from the upper terminal to the lower terminal by sharing the forward current between a FET switch and a BJT switch, the selectively conducting when a control terminal is asserted (block 804). When the hybrid switch is reversed biased, the example method comprises non-selectively conducting a reverse current from the lower terminal to the upper terminal (block 806). In some cases, the non-selectively conducting reverse current may comprise: initially conducting the reverse current through the first diode (block 808), and then conducting the reverse current through the FET switch and/or the BJT switch (block 810). Thereafter, the method ends (block 812).

The present disclosure includes references to "an embodiment" or groups of "embodiments." As used herein, embodiments are different implementations of instances of the disclosed concepts. References to "an embodiment," "some embodiments," and the like do not necessarily refer to the same embodiment. Many embodiments are possible and contemplated, including those specifically disclosed as well as modifications or alternatives that fall within the spirit or scope of the disclosure.

The above disclosure is meant to illustrate the principles and various embodiments of the disclosed concepts. Numerous variations and modifications will become apparent to those skilled in the art once the above disclosure is fully appreciated. It is intended that the following claims be interpreted to embrace all such variations and modifications.

What is claimed is:

1. A method operating a hybrid switch, the method comprising:
   sensing a voltage across an upper terminal and a lower terminal of the hybrid switch, the hybrid switch is forward biased when the upper terminal has higher voltage, and the hybrid switch is reverse biased when the lower terminal has higher voltage;
   when the hybrid switch is forward biased, selectively conducting a forward current from the upper terminal to the lower terminal by sharing the forward current between a FET switch and a BJT switch, the selectively conducting when a control terminal is asserted; and
   when the hybrid switch is reversed biased, non-selectively conducting a reverse current from the lower terminal to the upper terminal.

2. The method of claim 1 wherein conducting the reverse current further comprises: initially conducting the reverse current through a first diode; and then conducting the reverse current through the BJT switch.

3. The method of claim 2 wherein conducting the reverse current further comprises sharing the reverse current between the BJT switch and the FET switch.

4. The method of claim 2 wherein the first diode is a body diode of the FET switch.

5. The method of claim 2 wherein the first diode is a discrete diode.

6. The method of claim 2 wherein the first diode is a silicon carbide diode having an anode coupled to the lower terminal a cathode coupled to the upper terminal.

7. The method of claim 1 wherein selectively conducting the forward current further comprises, responsive to assertion of the control terminal:
conducting the forward current through the FET switch; and then
conducting a first portion of the forward current through the FET switch and a second portion through the BJT switch.

8. The method of claim 7 wherein selectively conducting the forward current further comprises, responsive to de-assertion of the control terminal:
making the BJT switch non-conductive and conducting the forward current through the FET switch; and then
making FET switch non-conductive.

9. The method of claim 1 further comprising at least one selected from a group comprising: the FET switch comprises plurality of FETs coupled in parallel; and the BJT switch comprises a plurality of BJTs coupled in parallel.

10. A hybrid switch comprising:
an upper terminal, a lower terminal, and a control terminal;
a BJT defining an upper base, a lower base, an upper collector-emitter coupled to the upper terminal, and a lower collector-emitter;
a lower cascode FET defining a drain coupled to the lower collector-emitter, a source coupled to the lower terminal, and a gate;
a main FET defining a drain coupled to the upper terminal, a source coupled to the lower terminal, and a gate;
a diode having an anode coupled to the lower terminal and a cathode coupled to the upper terminal;
a driver coupled to the upper terminal, the lower terminal, the control terminal, the upper base, the lower base, the gate of the lower cascode FET, and the gate of the main FET, the driver configured to:
sense an applied voltage across the upper terminal and the lower terminal;
when the applied voltage is more positive on the upper terminal and the control terminal is de-asserted, arrange the BJT and main FET to block current flow through the hybrid switch;
when the applied voltage is more positive on the upper terminal and the control terminal is asserted, enable a forward current to flow through from the upper terminal to the lower terminal, with the forward current shared between main FET and the BJT; and
when the applied voltage is more positive on the lower terminal, enable a reverse current to flow through the hybrid switch.

11. The hybrid switch of claim 10 wherein when the driver enables the reverse current to flow, the driver is configured to:
allow the reverse current to initially flow through the diode; and then arrange the BJT such that the reverse current flows through the BJT.

12. The hybrid switch of claim 10 wherein when the driver enables the reverse current to flow, the driver is further configured to arrange the main FET such that the reverse current is shared between the BJT and the main FET.

13. The hybrid switch of claim 10 wherein the diode is a body diode of the main FET.

14. The hybrid switch of claim 10 wherein the diode is a discrete diode distinct from the main FET.

15. The hybrid switch of claim 10 wherein the diode is a silicon carbide diode.

16. The hybrid switch of claim 10 wherein when the driver enables the forward current to flow, the driver is configured to:
assert the gate of the main FET; and then
arrange the BJT to be conductive in an active-on mode.

17. The hybrid switch of claim 16 wherein when the applied voltage is more positive on the upper terminal and the control terminal becomes de-asserted, the driver is configured to:
make the BJT non-conductive while maintaining an asserted state of the gate of the main FET; and then
de-assert the gate of the main FET to make main FET non-conductive.

18. The hybrid switch of claim 10 further comprising:
an upper cascode FET defining a drain coupled to the upper terminal, a source coupled to the upper collector-emitter, and gate coupled to the driver;
the driver is coupled to the lower collector-emitter; and
wherein when the applied voltage is more positive on the upper terminal and the control terminal transitions from asserted to de-asserted, the driver is further configured to:
make the upper cascode FET non-conductive; and
drive a reverse-recovery bias voltage to the lower collector-emitter.

\* \* \* \* \*